(12) United States Patent
Yu

(10) Patent No.: US 11,037,961 B2
(45) Date of Patent: Jun. 15, 2021

(54) ARRAY SUBSTRATE AND DISPLAY PANEL

(71) Applicant: WUHAN CHINA STAR OPTOELECTRONICS TECHNOLOGY CO., LTD., Hubei (CN)

(72) Inventor: Hualun Yu, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 212 days.

(21) Appl. No.: 16/464,615

(22) PCT Filed: Apr. 19, 2019

(86) PCT No.: PCT/CN2019/083402
§ 371 (c)(1),
(2) Date: May 28, 2019

(87) PCT Pub. No.: WO2020/124903
PCT Pub. Date: Jun. 25, 2020

(65) Prior Publication Data
US 2021/0098496 A1  Apr. 1, 2021

(30) Foreign Application Priority Data
Dec. 20, 2018  (CN) .......................... 201811560469.5

(51) Int. Cl.
*H01L 27/12* (2006.01)
*G02F 1/1362* (2006.01)

(52) U.S. Cl.
CPC ...... *H01L 27/124* (2013.01); *G02F 1/136204* (2013.01); *G02F 1/136286* (2013.01); *G02F 2202/22* (2013.01)

(58) Field of Classification Search
CPC ......... G02F 1/136204; G02F 1/136286; G02F 2202/22; H01L 27/124
See application file for complete search history.

(56) References Cited

U.S. PATENT DOCUMENTS

| 5,719,648 A * | 2/1998 | Yoshii ................... G02F 1/1309 349/42 |
| 2007/0159567 A1 | 7/2007 | Lin et al. |
| 2007/0194317 A1 | 8/2007 | Lim et al. |

(Continued)

FOREIGN PATENT DOCUMENTS

| CN | 101000440 A | 7/2007 |
| CN | 101025489 A | 8/2007 |

(Continued)

*Primary Examiner* — Allan R Wilson

(57) ABSTRACT

An array substrate comprises a display region provided with a thin film transistor circuit; a non-display provided with a drive circuit, at least one anti-static circuit and a dummy thin film transistor circuit. By disposing the dummy thin film transistor circuit and at least one of the anti-static circuits between the thin film transistor circuit and the drive circuit, the static electricity will not be released into an overlap region of a gate line and a polysilicon line, thereby solving technical problem that short circuit occurs between a gate layer and a polysilicon active layer.

17 Claims, 2 Drawing Sheets

(56) References Cited

U.S. PATENT DOCUMENTS

| | | | | |
|---|---|---|---|---|
| 2013/0106677 A1* | 5/2013 | Koo | ......................... | G09G 3/36 |
| | | | | 345/87 |
| 2017/0141129 A1 | 5/2017 | Hwang et al. | | |
| 2019/0312061 A1* | 10/2019 | Son | ..................... | H01L 27/1225 |
| 2020/0064700 A1* | 2/2020 | Cheng | ................. | H01L 27/0296 |

FOREIGN PATENT DOCUMENTS

| | | |
|---|---|---|
| CN | 101566772 A | 10/2009 |
| CN | 105741684 A | 7/2016 |
| CN | 106356381 A | 1/2017 |
| CN | 107452352 A | 12/2017 |
| CN | 107577099 A | 1/2018 |
| CN | 207896091 U | 9/2018 |
| WO | 2006016662 A1 | 5/2008 |

* cited by examiner

ARRAY SUBSTRATE AND DISPLAY PANEL

FIELD OF INVENTION

The present invention relates to a technical field of liquid crystal display, in particular to an array substrate and a display panel.

BACKGROUND OF INVENTION

The conventional array substrate comprises a gate line, a data line disposed in the display region, and a drive circuit disposed at the frame area, the gate line in the display region needs to be connected to the drive circuit, thereby causing sealants and liquid crystals at the junction to be abnormal.

Therefore, the conventional array substrate has a technical problem that sealants and liquid crystals are abnormal at the junction of a gate line and a drive circuit.

SUMMARY OF INVENTION

The present invention provides an array substrate to alleviate the technical problem that sealants and liquid crystals are abnormal at the junction of a gate line and a drive circuit.

To solve the above problem, the present invention provides the technical solution as follows:

The present invention provides an array substrate, comprising:
a display region provided with a thin film transistor circuit;
a non-display region provided with a drive circuit, at least one anti-static circuit, and a dummy thin film transistor circuit;

A gate line of the film transistor circuit is electrically connected to the drive circuit through a gate line of the dummy thin film transistor circuit;

The anti-static circuit is disposed at an end of the gate line of the dummy thin film transistor circuit away from the thin film transistor circuit.

In the present invention, the anti-static circuit comprises at least one first electrode, at least one second electrode and an insulating layer disposed between the first electrode and the second electrode, the first electrode is electrically connected to the gate line of the dummy thin film transistor circuit.

In the present invention, the first electrode and the gate line of the dummy thin film transistor circuit are disposed in the same layer.

In the present invention, the first electrode is an end of the gate line of the dummy thin film transistor.

In the present invention, the first electrode is a rectangular structure.

In the present invention, the second electrode and a polysilicon active layer of the array substrate are disposed in the same layer.

In the present invention, the second electrode is a rectangular structure.

In the present invention, the plurality of first electrodes of the plurality of anti-static circuits share the second electrode.

In the present invention, a protrusion is provided in a direction from the first electrode to the second electrode.

In the present invention, at least one of the data line of the dummy thin film transistor circuit or the gate line of the dummy thin film transistor circuit is not electrically connected to the polysilicon active layer.

The present of the invention also provides a display panel, comprising:
a display region provided with a thin film transistor circuit;
a non-display region provided with a drive circuit, at least one anti-static circuit, and a dummy thin film transistor circuit;

A gate line of the film transistor circuit is electrically connected to the drive circuit through a gate line of the dummy thin film transistor circuit; the anti-static circuit is disposed at an end of the gate line of the dummy thin film transistor circuit away from the thin film transistor circuit.

In the present invention, the anti-static circuit comprises at least one first electrode, at least one second electrode and an insulating layer disposed between the first electrode and the second electrode, the first electrode is electrically connected to the gate line of the dummy thin film transistor circuit.

In the present invention, the first electrode and the gate line of the dummy thin film transistor circuit are disposed in the same layer.

In the present invention, the first electrode is an end of the gate line of the dummy thin film transistor.

In the present invention, the first electrode is a rectangular structure.

In the present invention, the second electrode and a polysilicon active layer of the array substrate are disposed in the same layer.

In the present invention, the second electrode is a rectangular structure.

In the present invention, the plurality of first electrodes of the plurality of anti-static circuits share the second electrode.

In the present invention, a protrusion is provided in a direction from the first electrode to the second electrode.

In the present invention, at least one of the data line of the dummy thin film transistor circuit or the gate line of the dummy thin film transistor circuit is not electrically connected to the polysilicon active layer.

The beneficial effects of the present invention are described as follows: a display panel comprises an array substrate, the array substrate comprises a display region provided with a thin film transistor circuit; a non-display region provided with a drive circuit, at least one anti-static circuit, and a dummy thin film transistor circuit. A gate line of the thin film transistor circuit is electrically connected to the drive circuit through a gate line of the dummy thin film transistor circuit; the anti-static circuit is disposed at an end of the gate line of the dummy thin film transistor circuit away from the thin film transistor circuit. By disposing a dummy thin film transistor circuit between the thin film transistor circuit and the drive circuit, the junction of the thin film transistor circuit and the drive circuit will be black state when the display panel display, so that the abnormality of sealants and liquid crystals at the junction will not be displayed. By disposing the anti-static circuit between the dummy thin film transistor circuit and the drive circuit, the static electricity will not be released in an overlap region of a gate line and a polysilicon line, thereby solving technical problem that short circuit occurs between a gate layer and a polysilicon active layer, and further improving the quality of the array substrate.

DESCRIPTION OF DRAWINGS

In order to more clearly illustrate the embodiments or the technical solutions in the prior art, a brief introduction of drawings used in the embodiments or the prior art description will be described below. Apparently, the drawings in the following description are only some of the embodiments of the invention, and those skilled in the art can obtain other drawings based on these drawings without any creative effort.

DETAILED DESCRIPTION OF PREFERRED EMBODIMENTS

Figure 1:
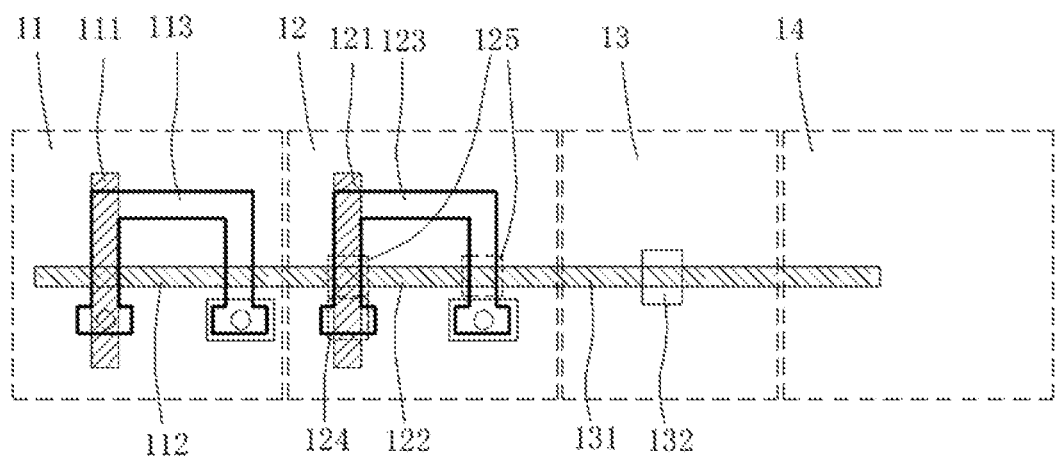
FIG. 1 is a schematic structural diagram of the array substrate according to the present invention.

The following description of the various embodiments is provided to illustrate the specific embodiments. Directional terms mentioned in the present invention, such as [upper], [lower], [front], [rear], [left], [right], [inside], [outside], [next to], etc., are only the reference of drawings. Therefore, the directional terms used are for the purpose of illustration and understanding, instead of limiting the present invention. In the drawings, the structurally similar components are denoted by the same reference numerals.

The present invention provides an array substrate to alleviate the technical problem that sealants and liquid crystals are abnormal at the junction of a gate line and a drive circuit.

FIG. 1 is a schematic structural diagram of the array substrate according to the present invention. The array substrate comprises a display region and a non-display region, a thin film transistor circuit 11 is disposed in the display region; a dummy thin film transistor circuit 12, at least one anti-static circuit 13 and a drive circuit 14 are disposed in the non-display region. A gate line 112 of the thin film transistor circuit 11 is electrically connected to the drive circuit 14 through a gate line 122 of the dummy thin film transistor circuit 12; the anti-static circuit 13 is disposed on the gate line 122 of the dummy thin film transistor circuit 12 away from an end of the thin film transistor circuit 11.

The thin film transistor circuit 11 comprises a data line 111, a gate line 112, a polysilicon line 113 which are layered from top to bottom; and a first insulating layer (not show in FIG. 1) disposed between the data line 111 and the polysilicon line 113 covering the gate line 112. The dummy thin film transistor circuit 12 comprises a data line 121, a gate line 122 and a polysilicon line 123 which are layered from top to bottom; a second insulating layer (not shown in the drawing) disposed between the data line 121 and the polysilicon line 123 covering the gate line 122.

At least one of the date line 121 of the dummy thin film transistor circuit 12 or the gate line 122 of the dummy thin film transistor circuit 12 is not electrically connected to a polysilicon active layer, that is, no opening is provided. Therefore, an overlap region 124 of the data line 121 and the polysilicon line 123 will be black state when the display panel display. By disposing a dummy thin film transistor circuit 12 between the thin film transistor circuit 11 and the drive circuit 14, the junction of the thin film transistor circuit 11 and the drive circuit 14 will be black state when the display panel display, so that the abnormality of sealants and liquid crystals at the junction of the thin film transistor circuit 11 and the drive circuit 14 will not be displayed.

A static electricity will build up in the dummy thin film transistor circuit 12 during a process of fabricating a substrate. The static electricity will flow through an overlap region 125 of the gate line 122 and the polysilicon line 123 when transmitted on the gate line 122 of the dummy thin transistor circuit 12. Due to the characteristic that static electricity is prone to build up on insulating materials, the static electricity formed during a process of fabricating a array substrate will be released into the overlap region 125 where the second insulating layer (not shown in FIG. 1) is disposed, thereby leading to defect and occurrence of a short circuit between a gate layer and the polysilicon active layer.

The anti-static circuit 13 comprises a first electrode 131, a second electrode 132 and a third insulating layer (not shown in FIG. 1) disposed between the first electrode 131 and the second electrode 132, the first electrode 131 is an end of the gate line 122 of the dummy thin film transistor circuit 12. Due to the characteristic that static electricity is prone to build up on insulating materials, the static electricity formed in a process of fabricating a array substrate can be collected at the first electrode 131 of the anti-static circuit 13 by disposing the anti-static circuit 13 at the end of the dummy thin film transistor circuit 12, then released by the second electrode 132 of the anti-static circuit 13, thereby avoiding the static electricity being released into the overlap region 125 of the dummy thin film transistor circuit 12, solving technical problem that short circuit occurs between the gate layer and the polysilicon active layer, and further improving the yield of the array substrate.

Figure 2:
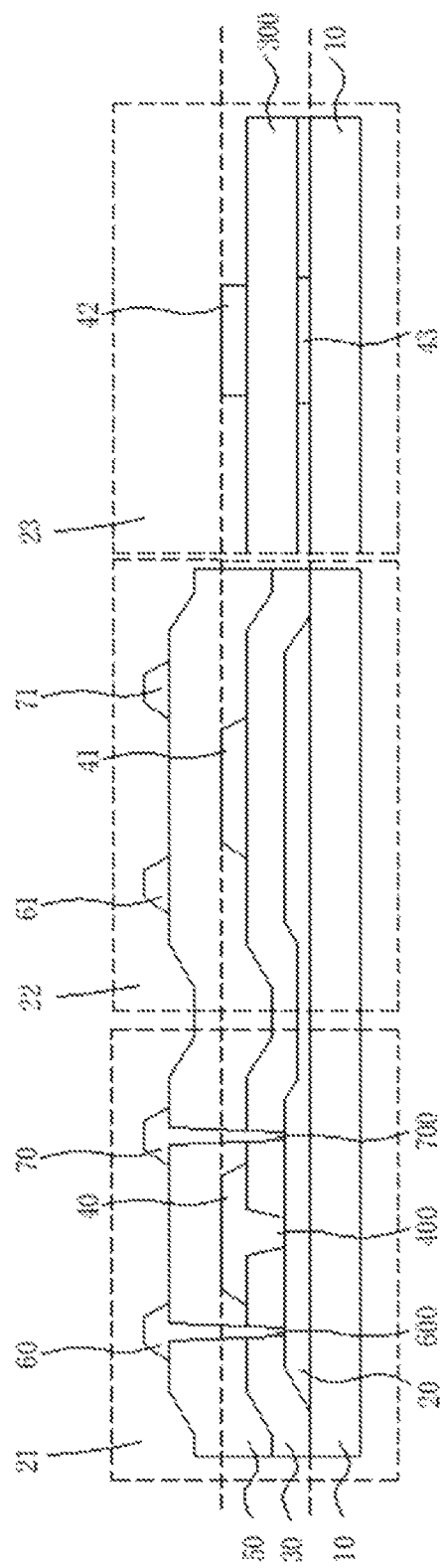
FIG. 2 is a schematic structural diagram film layer of the array substrate according to the present invention.

FIG. 2 is a schematic structural diagram film layer of the array substrate according to the present invention, the array substrate comprises a display region and a non-display region, the display region is provided with a thin film transistor circuit 21, and the non-display region is provided with a dummy thin film transistor circuit 22, an anti-static circuit 23, and a drive circuit (not shown in FIG. 2).

The thin film transistor circuit 21 comprises a substrate 10; a polysilicon active layer 20 disposed on the substrate 10; a gate insulating layer 30 covering the polysilicon active layer 20; a gate electrode 40 disposed on the gate insulating layer 30; an interlayer insulating layer 50 disposed on the gate insulating layer 30 and covering the gate electrode 41; a source electrode 60 and a drain electrode 70 disposed on the interlayer insulating layer 50, the gate electrode 40 is electrically connected to the polysilicon active layer 20 through a first opening 400, the source electrode 60 is electrically connected to the polysilicon active layer 20 through a second opening 600, the drain electrode 70 is electrically connected to the polysilicon active layer 20 through a third opening 700.

The dummy thin film transistor circuit 22 comprises the substrate 10; the polysilicon active layer 20 disposed on the substrate 10; the gate insulating layer 30 covering the polysilicon active layer 20; a gate electrode 41 disposed on the gate insulating layer 30; the interlayer insulating layer 50 disposed on the gate insulating layer 30 and covering the gate electrode 41; a source electrode 61 and a drain electrode 71 disposed on the interlayer insulating layer 50, the gate electrode 41 is electrically connected to the polysilicon active layer 20 through a forth opening 410, an opening is not provided between the source electrode 61 and the drain electrode 71 and the polysilicon active layer 20.

In one embodiment, at least one of the data line of the dummy thin film transistor circuit 22 or the gate line of the dummy thin film transistor circuit 22 is not electrically to the polysilicon active layer 20. The source electrode 61 and the drain electrode 71 are the data line of dummy thin film transistor circuit 22, the gate electrode 41 is the gate line of the dummy thin film transistor circuit 22. Specifically, there are three cases:

1. In the dummy thin film transistor circuit 22, an opening is disposed between the gate electrode 41 and the polysilicon active layer 20, and the gate electrode 41 is electrically connected to the polysilicon active layer 20. No opening is provided between source electrode 61 and the drain electrode 71 and the polysilicon active layer 20.

2. In the dummy thin film transistor circuit 22, no opening is provided between the gate electrode 41 and the polysilicon active layer 20, an opening is disposed between the source electrode 61, the drain electrode 71 and the polysilicon active layer 20. The source electrode 61, the drain electrode 71 and the polysilicon active layer 20 are electrically connected.

3. In the dummy thin film transistor circuit 22, no opening is provided between the gate electrode 41 and the polysilicon active layer 20. No opening is provided between the source electrode 61, the drain electrode 62 and the polysilicon active layer 20.

In the display panel, there is a problem that sealants and liquid crystals are abnormal at the junction of the thin film transistor circuit 21 and a drive circuit, the problem is hard to be improved directly, so the dummy thin film transistor circuit 22 is disposed between the thin film transistor circuit 21 and a drive circuit. Because at least one of the data line of the dummy thin film transistor circuit 22 or the gate line of the dummy thin film transistor circuit 22 is not electrically to the polysilicon active layer 20, the overlap region of the data line of the dummy thin film transistor circuit 22 and the polysilicon active layer 20 will be black state when the display panel display, so that the abnormality of the sealants and the liquid crystals at the junction will not be displayed, thereby solving the problem.

As shown is FIG. 2, the anti-static circuit 23 comprises a first electrode 42, a second electrode 43, and an insulating layer 300 disposed between the first electrode 42 and the second electrode 43, the first electrode 42 is electrically connected to the gate line 41 of the dummy thin film transistor circuit 22. A storage capacitor can be formed between the first electrode 42 and the second electrode 43, and static electricity can be released into the storage capacitor.

In one embodiment, the first electrode 42 and the gate line 41 of the dummy thin film transistor circuit 22 are disposed in the same layer.

In one embodiment, the first electrode 42 is an end of the gate line 41 of the dummy thin film transistor circuit 22. The gate line of the array substrate comprises the gate electrode 40 of the thin film transistor circuit 21, the gate electrode 41 of the dummy thin film transistor circuit 22 and the first electrode 42 of the anti-static circuit 23, the three are electrically connected in series and extend into the drive circuit.

In one embodiment, the second electrode 43 and the polysilicon active layer 20 of the array substrate are disposed in the same layer. The second electrode 43 is electrically connected to a metal layer where a common electrode of the array substrate is located in order to release static electricity of the array substrate.

In one embodiment, the first electrode 42 is a rectangular structure. The specific shape of the first electrode 42 may also have various options, such as a circular shape, a trapezoidal shape, or the like, as long as the shape satisfies the requirements for electrostatic discharge.

In one embodiment, the plurality of first electrodes 42 of the plurality of anti-static circuits 23 share the second electrode 43. The plurality of first electrodes 42 can discharge static electricity to the second electrode 43, the second electrode 43 is electrically connected to a metal layer where a common electrode of the array substrate is located in order to release static electricity of the array substrate. The structure that the plurality of the first electrodes 42 of the plurality of anti-static circuits 23 share a second electrode 43 can reduce the number of the second electrodes 43 of the array substrate, thereby simplifying the structure of the array substrate.

In one embodiment, a protrusion is provided in a direction from the first electrode 42 to the second electrode 43. Static electricity will build up on the protrusion, thereby better being transmitted to the second electrode 43.

The present invention also provides a display panel comprising the array substrate in the above embodiment.

According to the Above Embodiment:

The present invention provides an array substrate and a display panel, the array substrate comprises: a display region provided with a thin film transistor circuit; a non-display region provided with a drive circuit, at least one anti-static circuit and a dummy thin film transistor circuit. A gate line of the thin film transistor circuit is electrically connected to the drive circuit through a gate line of the dummy thin film transistor circuit. The anti-static circuit is disposed at an end of the dummy thin film transistor circuit away from the thin film transistor circuit. By disposing the dummy thin film transistor circuit between the thin film transistor circuit and the drive circuit, the junction of the thin film transistor circuit and the drive circuit will be black state when the display panel display, so that the abnormality of sealants and liquid crystals at the junction will not be displayed; By disposing the anti-static circuit between the dummy thin film transistor circuit and the drive circuit, the static electricity will not be released into an overlap region of the gate line of the dummy thin film transistor circuit and a polysilicon line, thereby improving technical problem that short circuit occurs between a gate layer and a polysilicon active layer, and further improving the yield of the array substrate.

In summary, although the present invention has been disclosed above in the preferred embodiments, the above preferred embodiments are not intended to limit the invention, those skilled in the art can make various modifications and refinements without departing from the scope of the present invention, and the scope of protection of the present invention is defined by the scope defined by the claims.

What is claimed is:

1. An array substrate, comprising: a display region provided with a thin film transistor circuit;
   a non-display region provided with a drive circuit, at least one anti-static circuit, and a dummy thin film transistor circuit;
   a gate line of the film transistor circuit is electrically connected to the drive circuit through a gate line of the dummy thin film transistor circuit;
   the anti-static circuit is disposed at an end of the gate line of the dummy thin film transistor circuit away from the thin film transistor circuit;
   wherein the anti-static circuit comprises at least one first electrode, at least one second electrode, and an insulating layer disposed between the first electrode and the second electrode, the first electrode is electrically connected to the gate line of the dummy thin film transistor circuit, and a protrusion is provided in a direction from the first electrode to the second electrode.

2. The array substrate as claimed of claim 1, wherein the first electrode and the gate line of the dummy thin film transistor circuit are disposed in the same layer.

3. The array substrate as claimed of claim 2, wherein the first electrode is an end of the gate line of the dummy thin film transistor circuit.

4. The array substrate as claimed of claim 2, wherein the first electrode is a rectangular structure.

5. The array substrate as claimed of claim 1, wherein the second electrode and a polysilicon active layer of the array substrate are disposed in the same layer.

6. The array substrate as claimed of claim 5, wherein the second electrode is a rectangular structure.

7. The array substrate as claimed of claim 1, wherein the plurality of first electrodes of the plurality of anti-static circuits share one of the second electrodes.

8. The array substrate as claimed of claim 5, wherein at least one of a data line of the dummy thin film transistor circuit or the gate line of the dummy thin film transistor is not electrically connected to the polysilicon active layer.

9. A display panel, comprising: an array substrate, the array substrate comprises:
- a display region provided with a thin film transistor circuit;
- a non-display region provided with a drive circuit, at least one anti-static circuit, and a dummy thin film transistor circuit;
- a gate line of the film transistor circuit is electrically connected to the drive circuit through a gate line of the dummy thin film transistor circuit;
- the anti-static circuit is disposed at an end of the gate line of the dummy thin film transistor circuit away from the thin film transistor circuit;
- wherein the anti-static circuit comprises at least one first electrode, at least one second electrode, and an insulating layer disposed between the first electrode and the second electrode, the first electrode is electrically connected to the gate line of the dummy thin film transistor circuit, and a protrusion is provided in a direction from the first electrode to the second electrode.

10. The display panel as claimed of claim 9, wherein the first electrode and the gate line of the dummy thin film transistor circuit are disposed in the same layer.

11. The display panel as claimed of claim 10, wherein the first electrode is an end of the gate line of the dummy thin film transistor circuit.

12. The display panel as claimed of claim 10, wherein the first electrode is a rectangular structure.

13. The display panel as claimed of claim 9, wherein the second electrode and a polysilicon active layer of the array substrate are disposed in the same layer.

14. The display panel as claimed of claim 13, wherein the second electrode is a rectangular structure.

15. The display panel as claimed of claim 9, wherein the plurality of first electrodes of the plurality of anti-static circuits share one of the second electrodes.

16. The display panel as claimed of claim 13, wherein at least one of a data line of the dummy thin film transistor circuit or the gate line of the dummy thin film transistor is not electrically connected to the polysilicon active layer.

17. An array substrate, comprising:
- a display region provided with a thin film transistor circuit; a non-display region provided with a drive circuit, at least one anti-static circuit, and a dummy thin film transistor circuit;
- a gate line of the film transistor circuit is electrically connected to the drive circuit through a gate line of the dummy thin film transistor circuit;
- the anti-static circuit is disposed at an end of the gate line of the dummy thin film transistor circuit away from the thin film transistor circuit;
- wherein the anti-static circuit comprises at least one first electrode, at least one second electrode, and an insulating layer disposed between the first electrode and the second electrode, the first electrode is electrically connected to the gate line of the dummy thin film transistor circuit, the first electrode and the gate line of the dummy thin film transistor circuit are disposed in a same layer, and the first electrode is an end of the gate line of the dummy thin film transistor circuit.

* * * * *